(12) United States Patent
Wang

(10) Patent No.: US 12,010,892 B2
(45) Date of Patent: Jun. 11, 2024

(54) DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventor: Lei Wang, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 986 days.

(21) Appl. No.: 16/966,074

(22) PCT Filed: Dec. 30, 2019

(86) PCT No.: PCT/CN2019/129966
§ 371 (c)(1),
(2) Date: Jul. 30, 2020

(87) PCT Pub. No.: WO2021/120324
PCT Pub. Date: Jun. 24, 2021

(65) Prior Publication Data
US 2023/0247887 A1  Aug. 3, 2023

(30) Foreign Application Priority Data
Dec. 20, 2019 (CN) .......................... 201911329619.6

(51) Int. Cl.
*H10K 59/38* (2023.01)
*H10K 59/12* (2023.01)
(Continued)

(52) U.S. Cl.
CPC ......... *H10K 59/38* (2023.02); *H10K 59/1201* (2023.02); *H10K 59/35* (2023.02); *H10K 59/40* (2023.02); *H10K 71/00* (2023.02)

(58) Field of Classification Search
CPC .................................................. H10K 59/40
See application file for complete search history.

(56) References Cited

U.S. PATENT DOCUMENTS

2015/0318447 A1   11/2015  Choi
2017/0338284 A1*  11/2017  Tang .................... H10K 59/35
(Continued)

FOREIGN PATENT DOCUMENTS

CN   104091893 A   10/2014
CN   107728389 A   2/2018
(Continued)

*Primary Examiner* — Jay C Chang
*Assistant Examiner* — Mikka Liu
(74) *Attorney, Agent, or Firm* — PV IP PC; Wei Te Chung; Zhigang Ma

(57) ABSTRACT

The present disclosure provides a display panel and a manufacturing method thereof. The display panel includes a thin-film transistor structure layer, an OLED light-emitting layer disposed on the thin-film transistor structure layer and including light-emitting color sub-pixels arranged at intervals, a touch layer disposed on the OLED light-emitting layer, and a color filter including color film layers disposed on the light-emitting color sub-pixels and a color resist layer located among the color film layers.

9 Claims, 3 Drawing Sheets

(51) Int. Cl.
  *H10K 59/35*  (2023.01)
  *H10K 59/40*  (2023.01)
  *H10K 71/00*  (2023.01)

(56) References Cited

U.S. PATENT DOCUMENTS

2018/0182817 A1* 6/2018 Jo .................. G06F 3/0412
2018/0188866 A1* 7/2018 Heo ................ G06F 3/0445
2019/0206945 A1  7/2019 Lin et al.

FOREIGN PATENT DOCUMENTS

CN  108493211 A  9/2018
CN  110034167 A  7/2019

* cited by examiner

DISPLAY PANEL AND MANUFACTURING METHOD THEREOF

FIELD OF INVENTION

The present disclosure relates to the technical field of display panels, and in particular, relates to a display panel and a manufacturing method thereof.

BACKGROUND OF INVENTION

Polarizers (POL) can effectively reduce the reflectivity of the panel under strong light, but lose nearly 58% of the light. For organic light-emitting diodes (OLED), it greatly increases the burden of its lifespan. Moreover, polarizers are thick and brittle, which is not conducive to the development of dynamic bending products. In order to develop dynamic bending products based on OLED display technology, new materials, new technologies, and new processes must be introduced to replace polarizers.

The use of color filters (CF) instead of polarizers in the prior art is classified as POL-less technology, which can not only reduce the thickness of the functional layer from 100 μm to 5 μm, but also increase the light extraction rate from 42% to 60%. The color filter structure includes red color resist (R), green color resist (G), blue color resist (B), and black matrix (BM). Based on the characteristics of OLED self-luminescence, the color resists need to correspond to the red, green, and blue sub-pixel units of the OLED, respectively, to form a color film functional layer. After spin coating or inkjet printing, the color filter still has a high reflection effect on the self-luminescence of OLED and ambient light, due to its own nature.

The combination of traditional touch layer and POL-less technology needs to consider the relative positional relationship between quantum dots and color filter structure. If the touch layer is placed on the color filter structure to increase the transmittance of the color filter structure, the metal wires of the touch layer are reflective, and the shadow of the metal wires can be clearly seen on the surface of the panel, thereby affecting user experience. If the touch layer is placed under the color filter structure, the black matrix of the color filter structure can hide the metal wires of the quantum dots from view.

Referring to FIG. 1, a schematic view of a display panel provided by the prior art is illustrated. The display panel 100 includes a light-emitting area 101, a non-light-emitting area 102, an array substrate 110, a touch layer 120 disposed on the array substrate 110, and a color filter 130 disposed on the touch layer 120. The array substrate 110 includes a thin-film transistor substrate layer 111, a light-emitting layer 112, and a thin film encapsulating layer 112 that are arranged in sequence. The touch layer 120 includes a planarization layer 121, a first metal layer 122, an insulating layer 123, a second metal layer 124, and a first protective layer 125 that are arranged in sequence. The first metal layer 122 and the second metal layer 124 are disposed in the non-light-emitting area 102, and the first metal layer 122 and the second metal layer 124 are connected. The color filter 130 includes a color resist layer 131 located in the light-emitting area 101, a black matrix layer 132 located in the non-light-emitting area 102, and a second protective layer 133 located on the color resist layer 131 and the black matrix layer 122.

The traditional process for manufacturing a display panel includes: disposing an array substrate 110; and disposing a touch layer 120 and a color filter 130, which are specifically divided into 4 photolithography processes. First, a planarization layer 121 is formed. Then a first photolithography process includes: forming a first metal layer 122; providing a first mask on the first metal layer 122; and forming the first metal layer 122 having a first metal electrode 1221 by etching. The second photolithography process includes: forming an insulating layer 123; proving a second mask on the insulating layer 123, and; forming the insulating layer 123 having a through hole by etching. The third photolithography process includes: forming a second metal layer 124, providing a third mask to place on the second metal layer 124; forming the second metal layer having a second metal electrode 1241 by etching; and disposing a first protective layer 125. At this point, the touch layer 120 is formed, and then the color filter 130 is formed on the touch layer 123. The fourth photolithography process includes: disposing a black matrix 122; providing a fourth mask on the black matrix 122; forming an opening through the black matrix 122 by etching; filling a color resist layer 121 in the opening; and disposing a protective layer 123 on the black matrix 122 and the color resist layer 121.

However, the color filter layer 121 of the color filter 130 and the light-emitting layer 112 are separated by the thin-film encapsulation layer 113 and the touch layer 120. Therefore, the transmittance of the color filter 130 tends to decrease.

As a result, it is indeed necessary to develop a new type of display panel to overcome the defects of the prior art.

SUMMARY OF INVENTION

Technical Problem

An object of the present disclosure is to provide a display panel, which can solve the problem of reduction in the transmittance of color filters in the prior art.

Technical Solution

To achieve the above object, the present disclosure provides a display panel, which comprises: a thin-film transistor structure layer; an OLED light-emitting layer disposed on the thin-film transistor structure layer, wherein the OLED light-emitting layer includes a first light-emitting color sub-pixel, a second light-emitting color sub-pixel, and a third light-emitting color sub-pixel that are arranged at intervals; a touch layer disposed on the OLED light-emitting layer; and a color filter including a first color film layer disposed on the first light-emitting color sub-pixel, a second color film layer disposed on the second light-emitting color sub-pixel, a third color film layer disposed on the third light-emitting color sub-pixel, and a color resist layer located among the first color film layer, the second color film layer, and the third color film layer.

Further, in the other embodiment, the color resist layer includes: the first color film layer disposed on the touch layer; the second color film layer disposed on the first color film layer; and the third color film layer disposed on the second color film layer.

Further, in the other embodiment, the touch layer includes: a planarization layer disposed on a side of an array substrate facing the color filter; a first metal layer disposed on the planarization metal layer and including a first metal electrode been patterned; an insulating layer disposed on the planarization layer and covering the first metal layer, wherein the first color film layer and the insulating layer are provided in the same layer; and a second metal layer disposed on the insulating layer and including a second metal electrode been patterned, wherein the second metal electrode is connected to the first metal electrode, and the color resist layer is disposed on the second metal electrode.

Further, in the other embodiment, the display panel further includes: an opening penetrating from a surface of the color resist layer to a surface of the first color film layer; wherein the color filter further includes: a protective layer filled in the opening and covering the color resist layer.

Further, in the other embodiment, the protective layer is an organic protective glue.

Further, in the other embodiment, the first color film layer, the second color film layer, and the third color film layer are respectively one of a red color resist layer, a green color resist layer, and a blue color resist layer.

Further, in the other embodiment, a thickness of each of the red color resist layer, the green color resist layer, and the blue color resist layer is 2 um, and a light transmittance of the color resist layer is less than 0.5%.

Another object of the present disclosure is to provide a manufacturing method for manufacturing the display panel, and the manufacturing method comprises steps of: providing a thin-film transistor structure layer; disposing an OLED light-emitting layer on the thin-film transistor structure layer; forming a touch layer on the OLED light-emitting layer; and disposing a color filter on the touch layer, wherein a color resist layer is formed on the touch layer.

Further, in the other embodiment, the step of forming the touch layer includes: depositing silicon nitride material to form a planarization layer on an array substrate; depositing a metal material to form a first metal layer including a first metal electrode on the planarization layer; depositing a silicon nitride material to form an insulating layer on the first metal layer, and forming a through hole of the insulating layer penetrating the insulating layer; and depositing a metal material on the insulating layer, and forming a second metal layer including a second metal electrode in the through hole, wherein the second metal electrode is connected to the first metal electrode through the through hole.

Further, in the other embodiment, in the step of disposing the color filter, the color resist layer is formed by: depositing a red color resist material on the touch layer to form a red color resist layer; depositing a green color resist material on the red color resist layer to form a green color resist layer; and depositing a blue color resist material on the green color resist layer to form a blue color resist layer; wherein after forming the color resist layer, further including: providing a mask to place above the color resist layer, wherein the mask includes holes, a photoresist is coated on the mask and the color resist layer corresponding to the holes, and the color resist layer corresponding to the holes is removed to form a first hole penetrating the color resist layer; etching the second metal layer in the first hole and removing the insulating layer corresponding to the first hole to form a second hole, wherein the first hole and the second hole commonly form an opening; depositing a color resist material in the opening to form a first color film layer, wherein the first color film is provided in the same layer as the insulating layer; and filling an organic protective glue in the opening and covering the color resist layer to form a protective layer.

Beneficial Effects

Compared with the existing technology, the beneficial effect of the present disclosure is to provide a display panel and a manufacturing method thereof, wherein the color resist layer can be used instead of the black matrix to block the light emission of the metal layer in the touch layer and reduce the reflection of the metal layer, and the manufacturing process is simple and simplified, and a photolithography process can be eliminated to save costs. The color resist layer and the insulating layer are arranged in the same layer, which can shorten the distance between the color resist layer and the light emitting layer, so as to improve the light transmittance of the color filter.

DESCRIPTION OF DRAWINGS

In order to more clearly illustrate technical solutions in embodiments of the present disclosure, the drawings used in the description of the embodiments will be briefly introduced below. Obviously, the drawings in the following description are only some embodiments of the present disclosure, and those skilled in the art can obtain other drawings according to these drawings without any creative effort.

Figure 1:
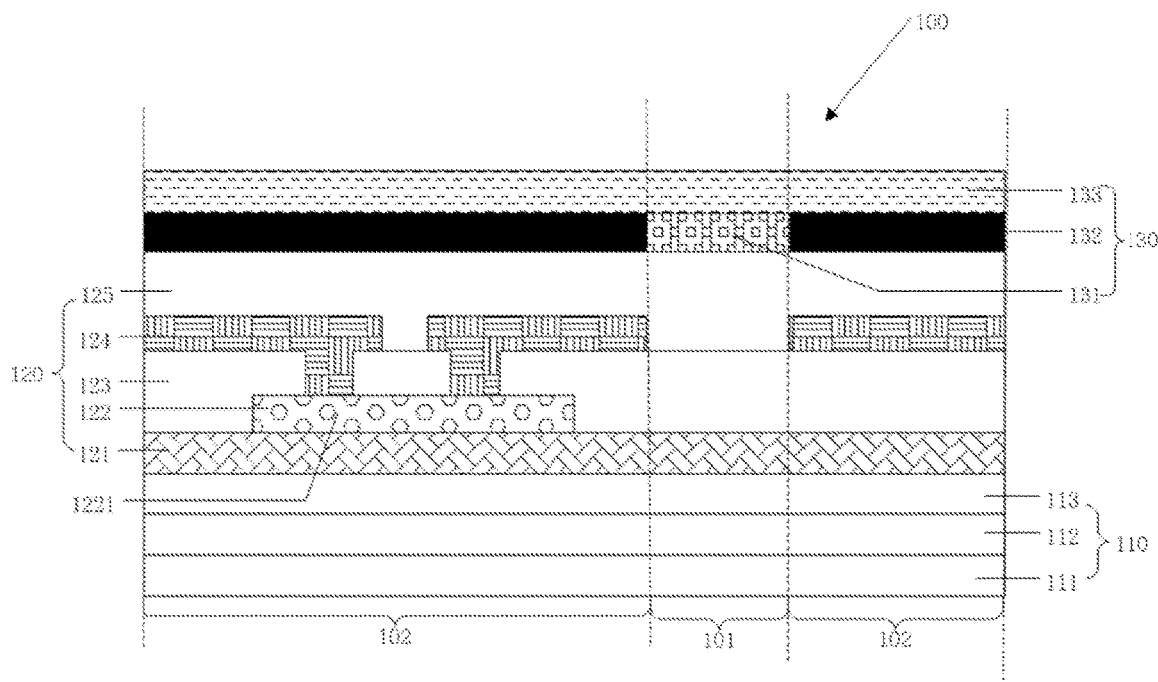
FIG. 1 is a schematic view of a display panel provided by the prior art.

REFERENCE NUMBERS IN THE BACKGROUND display panel 100;
light-emitting area 101; non-light-emitting area 102;
array substrate 110; touch layer 120; color filter 130;
thin-film transistor structure layer 111; light-emitting layer 112; thin-film encapsulation layer 113;
planarization layer 121; first metal layer 122; insulating layer 123;
second metal layer 124; first protective layer 125;
color resist layer 131; black matrix 132; second protective layer 133.

Reference numbers in the specific embodiment:
display panel 100;
light-emitting area 101; non-light-emitting area 102;
array substrate 110; touch layer 120; color filter 130;
thin-film transistor structure layer 111; light-emitting layer 112; thin-film encapsulation layer 113;
planarization layer 121; first metal layer 122; first metal electrode 1221;
insulating layer 123; through hole 1231;
second metal layer 124; second method electrode 1241;
color resist layer 131; red color resist layer 1311; green color resist layer 1312;
blue color resist layer 1313; protective layer 132;
opening 140; first color film layer 133;
third mask 150; hole 151; photoresist 160;
first hole 141; second hole 142.

DETAILED DESCRIPTION OF PREFERRED EMBODIMENTS

The technical solutions in the embodiments of the present disclosure will be described clearly and completely in conjunction with the drawings in the embodiments of the present disclosure. Obviously, the described embodiments are only a part of the embodiments of the present disclosure, but not all the embodiments. Based on the embodiments of the present disclosure, all other embodiments obtained by those of ordinary skill in the art without making creative efforts fall within the protection scope of the present disclosure.

The specific structural and functional details disclosed herein are merely representative and are used for the purpose of describing exemplary embodiments of the present disclosure. However, the present disclosure can be implemented in many alternative forms, and should not be interpreted as being limited to the embodiments set forth herein.

Figure 2:
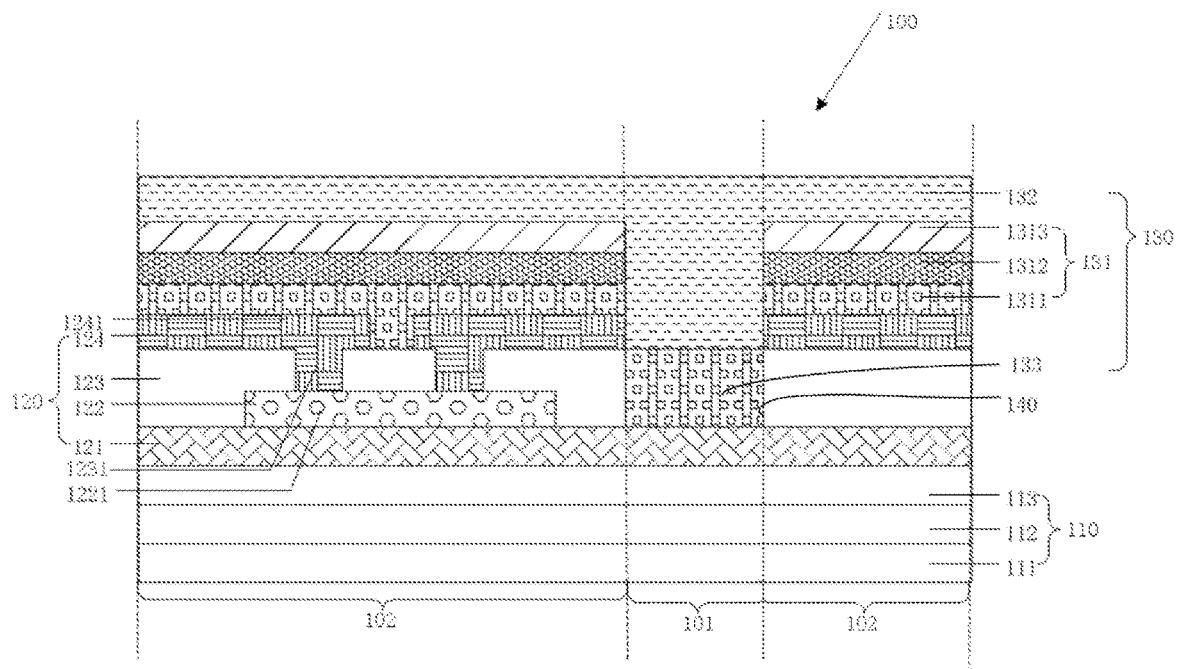
FIG. 2 is a schematic view of a display panel according to an embodiment of the present disclosure.

The embodiment provides a display panel. Referring to FIG. 2, which is a schematic view of a display panel according to an embodiment of the present disclosure. The display panel 100 includes a light-emitting area 101, a non-light-emitting area 102, an array substrate 110, a touch layer 120 disposed on the array substrate 110, and a color filter 130, wherein a side of the color filter 130 facing the array substrate 110 including a color resist layer 131, the color resist layer 131 is disposed in the non-light-emitting area 102, and the side of the color filter 130 including the color resist layer 131 covers the touch layer 120.

The array substrate 110 includes a thin-film transistor structure layer 111, an organic light-emitting diode (OLED) light-emitting layer 112 disposed on a side of the thin-film transistor structure layer 111 facing the touch layer 120 and including a plurality of light-emitting sub-pixels, and a thin-film encapsulation layer 113 disposed on the light-emitting layer 112. Specifically, the thin-film transistor structure layer 111 includes a base substrate, a buffer layer disposed on the base substrate, an active layer disposed on the buffer layer, a gate planarization layer disposed on the active layer, a gate layer disposed on the gate planarization layer, a source-drain layer disposed on the gate layer, a protective layer disposed on the source-drain layer, and a pixel electrode layer disposed on the protective. The thin-film transistor structure layer 111 includes plurality of sub-pixels arranged in an array, and each of the sub-pixels includes the active layer, the gate planarization layer, the gate layer, and the source-drain layer. The design of the present disclosure is the color filter 130, so that specific structure of the thin film transistor structure layer 111 will not be described.

The touch layer 120 includes a planarization layer 121 disposed on the thin-film encapsulation layer 113, a first metal layer 122 disposed on the planarization layer 121 and located in the non-light-emitting area 102, wherein the first metal layer 122 has a first metal electrode 1221 been patterned, an insulating layer 123 disposed on planarization layer 121 and covering the first metal layer 122, wherein the insulating layer 123 is provided with a through hole 1231, a second metal layer 124 disposed on the insulating layer 123 and located in the non-light-emitting area 102, wherein the second metal layer 124 has a second electrode 1241 been patterned, and the second metal electrode 1241 is connected to the first metal electrode 1221 through the through hole 1231.

The color resist layer 131 includes a red color resist layer 1311 disposed on the second metal layer 124, a green color resist layer 1312 disposed on the red color resist layer 1311, and a blue color resist layer 1313 disposed on the green color resist layer 1312, wherein a thickness of each of the red color resist layer 1311, the green color resist layer 1312, and the blue color resist layer 1313 is 2 um, and a light transmittance of the color resist layer 131 is less than 0.5%. The black matrix in the prior art has a light transmittance of 0.05% at a thickness of 1.2 um. In the embodiment, there is no significant difference between the light transmittance of the color resist layer 131 and the light transmittance of the black matrix in the prior art, and the black matrix is also located in the non-light-emitting area. Therefore, the color resist layer can be used instead of the black matrix to block the light emission of the metal layer in the touch layer and reduce the reflection of the metal layer.

The display panel further includes an opening 140 that penetrates from a surface of the color resist layer 131 to a surface of the planarization layer 121 and is located in the light-emitting area 101.

The color filter 130 further includes a first color film layer 133 and a protective layer 132. The first color film layer 133 is disposed in the opening 140 and disposed in the same layer as the insulating layer 123. The first color film layer 133 includes a plurality of color resist units, each of the color resist units is on the red color resist, blue color resist, and green color resist. Each of the color resist units corresponds to a light-emitting unit. The protective layer 132 is filled in the opening 140 and covers the blue color resist layer 1313. The material used for the protective layer 132 is organic protective (OC) glue.

The first color film layer 133 and the insulating layer 123 are arranged in the same layer, and the first color film layer 133 and the light-emitting layer 112 are only separated by the thin-film encapsulation layer 113 and the planarization layer 121. The distance between the first color film layer 133 and the light-emitting layer 112 is shortened, and the light transmittance of the color filter can be improved.

In other embodiments, the opening 140 penetrates from the surface of the color resist layer 131 to the surface of the thin-film encapsulation layer 113 and is located in the light-emitting area 101. The first color film layer 133 is disposed in the opening 140 and disposed in the same layer as the planarization layer 121. The first color film layer 133 and the planarization layer 121 are arranged in the same layer, and the first color film layer 133 and the light-emitting layer 112 are only separated by a thin-film encapsulation layer 113. The distance between the first color film layer 133 and the light-emitting layer 112 is further shortened, and the light transmittance of the color filter is further improved.

Figure 3:
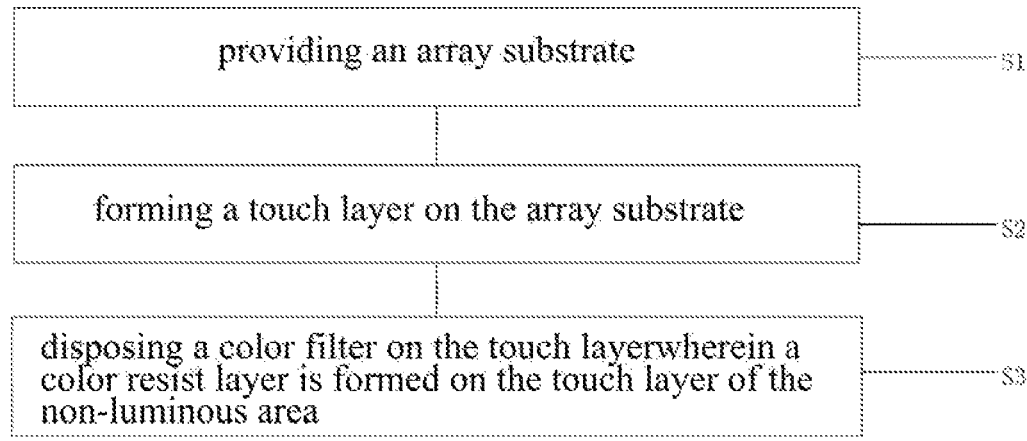
FIG. 3 is a flowchart of a method for manufacturing the display panel according to an embodiment of the present disclosure.

The embodiment also provides a manufacturing method for manufacturing the display panel. Referring to FIG. 3, which is a flowchart of a method for manufacturing the display panel according to an embodiment of the present disclosure. The manufacturing method of the display panel includes steps S1-S3.

Step S1: providing an array substrate 110, wherein step S1 includes: providing a thin-film transistor structure layer 111; forming an OLED light-emitting layer 112 on the thin-film transistor structure layer 111, and forming a thin-film encapsulation layer 113 on the light-emitting layer 112.

Step S2: forming a touch layer 120 on the array substrate 110.

Step S2 includes: depositing a silicon nitride material on the array substrate 110 to form a planarization layer 121; depositing a metal material on the non-light-emitting area 102 to form a first metal layer 122 on the planarization layer 121; providing a first mask on the first metal layer 122;

forming a first metal layer 122 having a first metal electrode 1221 by etching; depositing silicon nitride material to form an insulating layer 123 on the first metal layer 122; providing a second mask on the insulating layer 123; forming a through hole 1231 through the insulating layer 123 by etching; depositing a metal material on the insulating layer 123; and forming a second metal layer 124 having a second metal electrode 1241 in the through hole 1231. The second metal electrode 1241 is connected to the first metal electrode 1221 through the through hole 1231.

Step S3: forming a color filter 130 on the touch layer 120, wherein step S3 includes steps S31-S36.

Step S31: forming a color resist layer 131 on the touch layer 120 in the non-light-emitting area 102, wherein the step of forming the color resist layer 131 includes: depositing a red color resist material on the second metal layer 124 to form a red color resist layer 1331; depositing a green color resist material on the red color resist layer 1311 to form a green color resist layer 1312; depositing a blue color resist material on the green color resist layer 1312 to form a blue color resist layer 1313.

Figure 4:
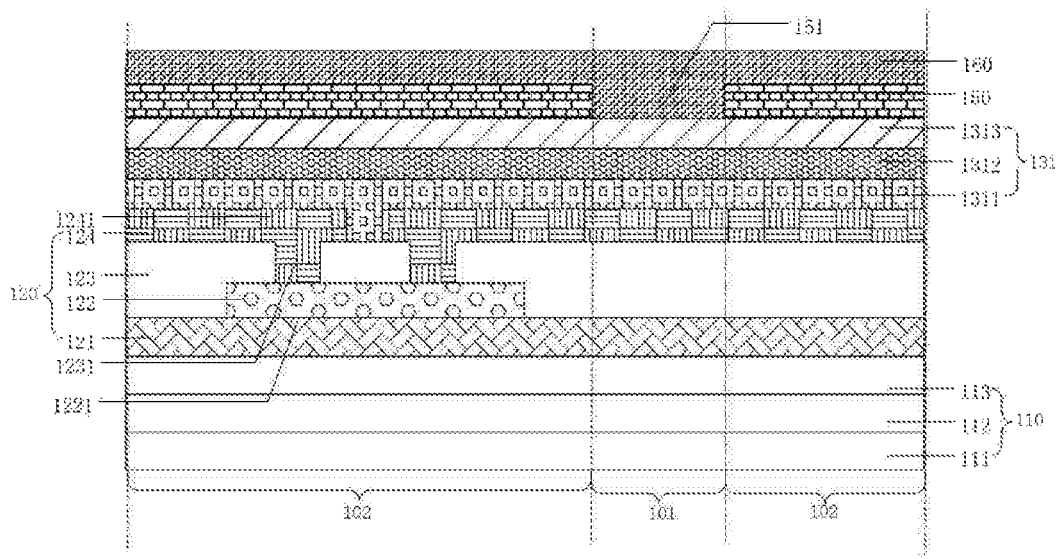
FIG. 4 is a schematic view at step S32 of the method for manufacturing the display panel according to an embodiment of the present disclosure.

Referring to FIG. 4, which is a schematic view at step S32 of the method for manufacturing the display panel according to an embodiment of the present disclosure.

Step S32: providing a third mask 150, wherein the third mask 150 is placed above the color resist layer 131. The third mask 150 forms a hole 151, a photoresist 160 is coated on the third mask 150, and the color resist layer 131 corresponding to the hole 151.

The third mask 150 is made of silicon nitride. The third mask 150 is placed above the color resist layer 131 to prevent damage to the color resist layer 131 when the photoresist 160 is stripped.

Figure 5:
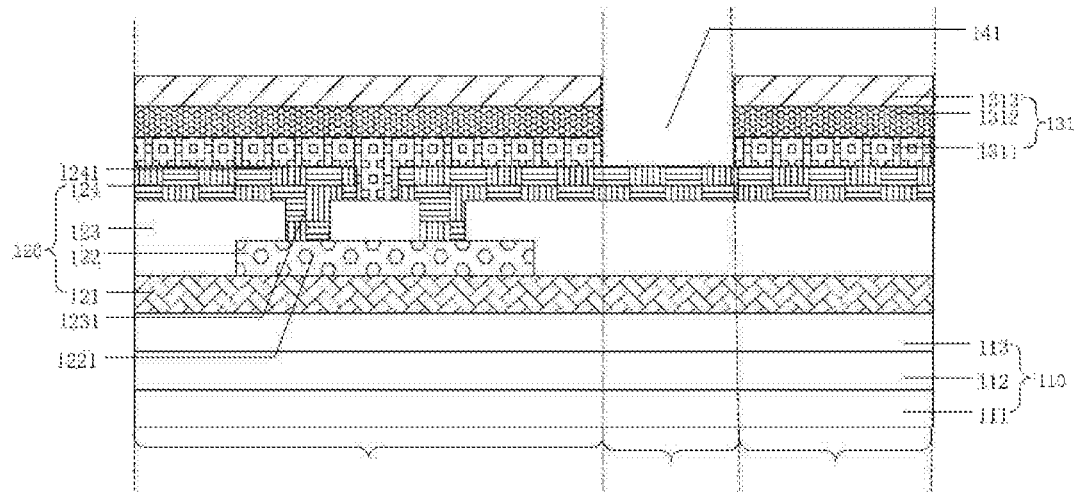
FIG. 5 is a schematic view at step S33 of the method for manufacturing the display panel according to an embodiment of the present disclosure.

Referring to FIG. 5, a schematic view at step S33 of the method for manufacturing the display panel according to an embodiment of the present disclosure is illustrated.

Step S33: etching to remove the color resist layer 131 corresponding to the hole 151 to form a first hole 141 penetrating the color resist layer 131.

Figure 6:
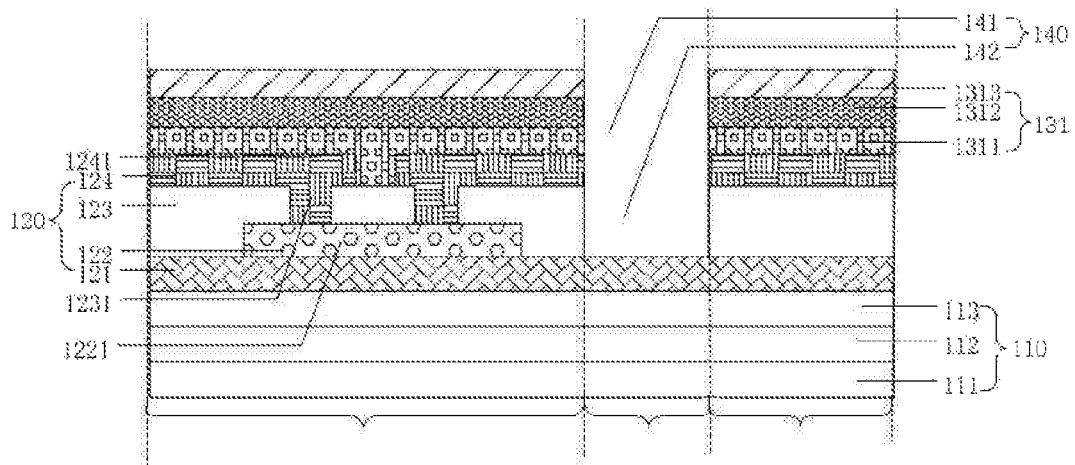
FIG. 6 is a schematic view at step S34 of the method for manufacturing the display panel according to an embodiment of the present disclosure.

Referring to FIG. 6, a schematic view at step S34 of the method for manufacturing the display panel according to an embodiment of the present disclosure is illustrated.

Step S34: in the first hole 141, etching the second metal layer 124 and removing the insulating layer 123 corresponding to the first hole 141 to form a second hole 142, and the first hole 141 and the second hole 142 form an opening 140.

Step S35: depositing a color resist material in the opening 140 to form a first color film layer 133, wherein the first color film layer 133 is provided in the same layer as the insulating layer 123.

Step S36: filling the opening 140 with the organic protective glue and covering the blue color resist layer 1313 to form a protective layer 132.

In the embodiment, the color resist layer is used instead of the black matrix to block the light emission of the metal layer in the touch layer and reduce the reflection of the metal layer. Moreover, the manufacturing process is simple and simplified, and a photolithography process can be eliminated to save costs.

The above are only preferred embodiments of the present disclosure. It should be noted that for those of ordinary skill in the art, without departing from the principles of the present disclosure, a number of improvements and retouches can be made, and these improvements and retouches should also be considered as the scope of protection of the present disclosure.

What is claimed is:

1. A display panel, comprising:
a thin-film transistor structure layer;
an organic light emitting diode (OLED) light-emitting layer disposed on the thin-film transistor structure layer, wherein the OLED light-emitting layer includes a first light-emitting color sub-pixel, a second light-emitting color sub-pixel, and a third light-emitting color sub-pixel that are arranged at intervals;
a touch layer disposed on the OLED light-emitting layer; and
a color filter including a first color film layer disposed on the first light-emitting color sub-pixel, and a color resist layer located near the first color film layer;
wherein the color resist layer includes the first color film layer disposed on the touch layer;
wherein the touch layer includes:
a planarization layer disposed on a side of an array substrate facing the color filter;
a first metal layer disposed on the planarization layer and including a first metal electrode been patterned;
an insulating layer disposed on the planarization layer and covering the first metal layer, wherein the first color film layer and the insulating layer are provided in a same layer; and
a second metal layer disposed on the insulating layer and including a second metal electrode been patterned, wherein the second metal electrode is connected to the first metal electrode, and the color resist layer is disposed on the second metal electrode;
wherein the display panel further includes an opening penetrating from a surface of the color resist layer to a surface of the first color film layer;
wherein the color filter further includes a protective layer filled in the opening and covering the color resist layer.

2. The display panel according to claim 1, wherein the protective layer is an organic protective glue.

3. The display panel according to claim 1, wherein the first color film layer is one of a red color resist layer, a green color resist layer, and a blue color resist layer.

4. The display panel according to claim 3, wherein a thickness of each of the red color resist layer, the green color resist layer, and the blue color resist layer is 2 μm, and a light transmittance of the color resist layer is less than 0.5%.

5. A display device, comprising the display panel according to claim 1.

6. The display device according to claim 5, wherein the protective layer is an organic protective glue.

7. The display device according to claim 5, wherein the first color film layer is one of a red color resist layer, a green color resist layer, and a blue color resist layer.

8. The display device according to claim 7, wherein a thickness of each of the red color resist layer, the green color resist layer, and the blue color resist layer is 2 μm, and a light transmittance of the color resist layer is less than 0.5%.

9. A manufacturing method for manufacturing a display panel, wherein the manufacturing method comprises steps of:
providing a thin-film transistor structure layer;
disposing an organic light emitting diode (OLED) light-emitting layer on the thin-film transistor structure layer;
forming a touch layer on the OLED light-emitting layer; and
disposing a color filter on the touch layer, wherein a color resist layer is formed on the touch layer;

wherein the step of forming the touch layer includes:
  depositing silicon nitride material to form a planarization layer on an array substrate;
  depositing a metal material to form a first metal layer including a first metal electrode on the planarization layer;
  depositing a silicon nitride material to form an insulating layer on the first metal layer, and forming a through hole of the insulating layer penetrating the insulating layer; and
  depositing a metal material on the insulating layer, and forming a second metal layer including a second metal electrode in the through hole, wherein the second metal electrode is connected to the first metal electrode through the through hole;
wherein in the step of disposing the color filter, the color resist layer is formed by:
  depositing a red color resist material on the touch layer to form a red color resist layer;
  depositing a green color resist material on the red color resist layer to form a green color resist layer; and
  depositing a blue color resist material on the green color resist layer to form a blue color resist layer;
wherein after forming the color resist layer, further including:
  providing a mask to place above the color resist layer, wherein the mask includes holes, a photoresist is coated on the mask and the color resist layer corresponding to the holes, and the color resist layer corresponding to the holes is removed to form a first hole penetrating the color resist layer;
  etching the second metal layer in the first hole and removing the insulating layer corresponding to the first hole to form a second hole, wherein the first hole and the second hole commonly form an opening;
  depositing a color resist material in the opening to form a first color film layer, wherein the first color film is provided in a same layer as the insulating layer; and
  filling an organic protective glue in the opening and covering the color resist layer to form a protective layer.

* * * * *